US012627150B2

(12) United States Patent
Lee et al.

(10) Patent No.: US 12,627,150 B2
(45) Date of Patent: May 12, 2026

(54) SYSTEM AND METHOD FOR CONTROLLING POWER DISTRIBUTION SYSTEMS USING GRAPH-BASED REINFORCEMENT LEARNING

(71) Applicant: Siemens Aktiengesellschaft, Munich (DE)

(72) Inventors: Xian Yeow Lee, Ames, IA (US); Yubo Wang, Princeton, NJ (US); Ulrich Muenz, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 978 days.

(21) Appl. No.: 17/860,323

(22) Filed: Jul. 8, 2022

(65) Prior Publication Data

US 2023/0074995 A1      Mar. 9, 2023

Related U.S. Application Data

(60) Provisional application No. 63/242,164, filed on Sep. 9, 2021.

(51) Int. Cl.
H02J 3/32 (2026.01)
G01R 19/00 (2006.01)

(52) U.S. Cl.
CPC ............ H02J 3/32 (2013.01); G01R 19/0084 (2013.01)

(58) Field of Classification Search
None
See application file for complete search history.

(56) References Cited

U.S. PATENT DOCUMENTS 10,725,075 B2 *  7/2020  Williams .......... H02J 13/00034
10,740,775 B2 *  8/2020  Hammerstrom ....... G05B 15/02
(Continued)

FOREIGN PATENT DOCUMENTS

CN     111293703 A     6/2020
CN     111799808 A     10/2020
(Continued)

OTHER PUBLICATIONS

C. Roberts et al., "Deep Reinforcement Learning for DER Cyber-Attack Mitigation," 2020 IEEE International Conference on Communications, Control, and Computing Technologies for Smart Grids (SmartGridComm), Tempe, AZ, USA, 2020, pp. 1-7, doi: 10.1109/SmartGridComm47815.2020.9302997. (Year: 2020).*
(Continued)

*Primary Examiner* — Ayal I. Sharon

(57)                    ABSTRACT

A method for controlling a power distribution system having a number of nodes and controllable grid assets associated with at least some of the node includes acquiring observations via measurement signals associated with respective nodes and generating a graph representation of a system state based on the observations and topological information of the power distribution system. The topological information is used to determine edges defining connections between nodes. The observations are used to determine nodal features of respective nodes, which are indicative of a measured electrical quantity and a status of controllable grid assets associated with the respective node. The graph representation is processed using a reinforcement learned control policy to output a control action for effecting a change of status of one or more of the controllable grid assets, to regulate voltage and reactive power flow in the power distribution system based on a volt-var optimization objective.

13 Claims, 7 Drawing Sheets

(56)                    References Cited

U.S. PATENT DOCUMENTS

| | | | | |
|---|---|---|---|---|
| 2013/0138260 A1* | 5/2013 | Divan | .................... | H02J 3/16 |
| | | | | 700/298 |
| 2014/0172503 A1* | 6/2014 | Hammerstrom | ....... | G05B 15/02 |
| | | | | 705/7.31 |
| 2018/0321650 A1* | 11/2018 | Feng | ................. | H02J 13/00034 |
| 2019/0165580 A1 | 5/2019 | Doherty et al. | | |
| 2020/0049745 A1* | 2/2020 | Williams | ................ | H02J 13/00 |
| 2022/0115867 A1* | 4/2022 | Ratnayake | ............ | H02J 3/0012 |
| 2022/0376499 A1* | 11/2022 | Shaik | ....................... | H02J 3/004 |
| 2023/0018575 A1* | 1/2023 | Yubo | ................. | H02J 13/00001 |
| 2023/0071450 A1* | 3/2023 | Fan | ....................... | H02J 3/0075 |

FOREIGN PATENT DOCUMENTS

| | | | | |
|---|---|---|---|---|
| CN | 113036772 A | 6/2021 | | |
| CN | 113078641 A | 7/2021 | | |
| CN | 113363997 A | 9/2021 | | |
| CN | 120320399 A | * | 7/2025 | .......... G01R 19/0084 |
| EP | 2788832 B1 | * | 9/2018 | ................ H02J 3/16 |
| WO | WO-2020160427 A1 | * | 8/2020 | ........... G05B 19/042 |
| WO | WO-2024028345 A1 | * | 2/2024 | .............. G06F 17/11 |
| WO | WO-2024028348 A1 | * | 2/2024 | ............ H02J 3/0012 |
| WO | WO-2025061773 A1 | * | 3/2025 | ............ G06N 3/092 |

OTHER PUBLICATIONS

I. Alsaleh, "Model-free Reinforcement Learning for Demand Response in PV-rich Distribution Systems," 2022 Saudi Arabia Smart Grid (SASG), Riyadh, Saudi Arabia, 2022, pp. 1-5, doi: 10.1109/SASG57022.2022.10200928. (Year: 2022).*

C. Roberts, Sy-Toan Ngo, et al. "Deep Reinforcement Learning for DER Cyber-Attack Mitigation". Arxiv.org. https://arxiv.org/abs/2009.13088. Sep. 28, 2020 (Year: 2020).*

Salah U. Kadir, Subir Majumder, et al. "Reinforcement Learning based Proactive Control for Transmission Grid Resilience to Wildfire". Arxiv.org. https://arxiv.org/abs/2107.05756. Jul. 12, 2021 (Year: 2021).*

M. Mansourlakouraj, M. Gautam, H. Livani and M. Benidris, "Multi-Stage Volt/VAR Support in Distribution Grids: Risk-Aware Scheduling With Real-Time Reinforcement Learning Control," in IEEE Access, vol. 11, pp. 54822-54838, 2023, doi: 10.1109/ACCESS.2023.3280558. (Year: 2023).*

S. Sharma, A. Verma and B. K. Panigrahi, "Robustly Coordinated Distributed Voltage Control Through Residential Demand Response Under Multiple Uncertainties," in IEEE Transactions on Industry Applications, vol. 57, No. 4, pp. 4042-4058, Jul.-Aug. 2021, doi: 10.1109/TIA.2021.3079135. (Year: 2021).*

Liu D, Zeng P, Cui S, Song C. Deep Reinforcement Learning for Charging Scheduling of Electric Vehicles Considering Distribution Network Voltage Stability. Sensors (Basel). Feb. 2, 2023;23(3):1618. doi: 10.3390/s23031618. PMID: 36772657; PMCID: PMC9920735. (Year: 2023).*

C. Roberts, S.-T. Ngo, A. Milesi, A. Scaglione, S. Peisert and D. Arnold, "Deep Reinforcement Learning for Mitigating Cyber-Physical DER Voltage Unbalance Attacks," 2021 American Control Conference (ACC), New Orleans, LA, USA, 2021, pp. 2861-2867, doi: 10.23919/ACC50511.2021.9482815. (Year: 2021).*

S. Li, Y. Sun, M. Ramezani and Y. Xiao, "Artificial Neural Networks for Volt/VAR Control of DER Inverters at the Grid Edge," in IEEE Transactions on Smart Grid, vol. 10, No. 5, pp. 5564-5573, Sep. 2019, doi: 10.1109/TSG.2018.2887080. https://ieeexplore.ieee.org/abstract/document/8579177. (Year: 2019).*

M. Biserica, Y. Besanger, R. Caire, O. Chilard and P. Deschamps, "Neural Networks to Improve Distribution State Estimation—Volt Var Control Performances," in IEEE Transactions on Smart Grid, vol. 3, No. 3, pp. 1137-1144, Sep. 2012, doi: 10.1109/TSG.2012.2193673. (Year: 2012).*

A. Ma, J. Cao and P. R. Cortes, "Graph Neural Network Based Deep Reinforcement Learning for Volt-Var Control in Distribution Grids,"

2024 IEEE 15th Int'l Symposium on Power Electr. for Distributed Generation Systems (PEDG), Luxembourg, 2024, pp. 1-5, doi: 10.1109/PEDG61800.2024.10667392. (Year: 2024).*

M. Manbachi, H. Farhangi, A. Palizban and S. Arzanpour, "Predictive algorithm for Volt/VAR optimization of distribution networks using Neural Networks," 2014 IEEE 27th Canadian Conf. on Elect. and Computer Eng'g (CCECE), Toronto, Canada, 2014, pp. 1-7, doi: 10.1109/CCECE.2014.6901014. (Year: 2014).*

Carlak, H. and Kayar, E. (2025), Volt/VAr Regulation of the West Mediterranean Regional Electrical Grids Using SVC/STATCOM Devices With Neural Network Algorithms. Wind Energy, 28: e2976. https://doi.org/10.1002/we.2976 (Year: 2025).*

X. Sun, J. Qiu and J. Zhao, "Optimal Local Volt/Var Control for Photovoltaic Inverters in Active Distribution Networks," in IEEE Transactions on Power Systems, vol. 36, No. 6, pp. 5756-5766, Nov. 2021, doi: 10.1109/TPWRS.2021.3080039. https://ieeexplore.ieee.org/abstract/document/9430689 (Year: 2021).*

Y. Chen, B. Luckey, J. Wigmore, M. Davidson and A. Benigni, "Real-time volt/var optimization for distribution systems with photovoltaic integration," IECON 2017—43rd Annual Conference of the IEEE Industrial Electronics Society, Beijing, China, 2017, pp. 2658-2663, doi: 10.1109/IECON.2017.8216447. (Year: 2017).*

S. Gupta, V. Kekatos and S. Chatzivasileiadis, "Optimal Design of Volt/VAR Control Rules of Inverters Using Deep Learning," in IEEE Transactions on Smart Grid, vol. 15, No. 5, pp. 4731-4743, Sep. 2024, doi: 10.1109/TSG.2024.3381984. https://ieeexplore.ieee.org/abstract/document/10479527 (Year: 2024).*

Xian Yeow Lee, Soumik Sarkar, Yubo Wang, "A graph policy network approach for Volt-Var Control in power distribution systems", Applied Energy, vol. 323, 2022, 119530, ISSN 0306-2619, https://doi.org/10.1016/j.apenergy.2022.119530. (Year: 2022).*

Yuanqi Gao, Nanpeng Yu, "Model-augmented safe reinforcement learning for Volt-VAR control in power distribution networks", Applied Energy, vol. 313, 2022, 118762, ISSN 0306-2619, https://doi.org/10.1016/j.apenergy.2022.118762. (Year: 2022).*

Sayadi, F., Esmaeili, S. and Keynia, F. (2017), Two-layer volt/var/total harmonic distortion control in distribution network based on PVs output and load forecast errors. IET Gener. Transm. Distrib., 11: 2130-2137. https://doi.org/10.1049/iet-gtd.2016.1440 (Year: 2017).*

S. Allahmoradi, S. Afrasiabi, X. Liang, J. Zhao and M. Shahidehpour, "Data-Driven Volt/VAR Optimization for Modern Distribution Networks: A Review," in IEEE Access, vol. 12, pp. 71184-71204, 2024, doi: 10.1109/ACCESS.2024.3403035. (Year: 2024).*

Z. Yuan, G. Cavraro, M. K. Singh and J. Cortes, "Learning Provably Stable Local Volt/Var Controllers for Efficient Network Operation," in IEEE Transactions on Power Systems, vol. 39, No. 1, pp. 2066-2079, Jan. 2024, doi: 10.1109/TPWRS.2023.3268684. (Year: 2024).*

X. Sun and J. Qiu, "Two-Stage Volt/Var Control in Active Distribution Networks With Multi-Agent Deep Reinforcement Learning Method," in IEEE Transactions on Smart Grid, vol. 12, No. 4, pp. 2903-2912, Jul. 2021, doi: 10.1109/TSG.2021.3052998. (Year: 2021).*

X. Sun, J. Qiu, Y. Tao, Y. Ma and J. Zhao, "A Multi-Mode Data-Driven Volt/Var Control Strategy With Conservation Voltage Reduction in Active Distribution Networks," in IEEE Transactions on Sustainable Energy, vol. 13, No. 2, pp. 1073-1085, Apr. 2022, doi: 10.1109/TSTE.2022.3149267. (Year: 2022).*

W. Wang, N. Yu, Y. Gao and J. Shi, "Safe Off-Policy Deep Reinforcement Learning Algorithm for Volt-VAR Control in Power Distribution Systems," in IEEE Transactions on Smart Grid, vol. 11, No. 4, pp. 3008-3018, Jul. 2020, doi: 10.1109/TSG.2019.2962625. (Year: 2020).*

K. S. Swarup and P. S. Subash, "Neural network approach to voltage and reactive power control in power systems," Proceedings of 2005 International Conference on Intelligent Sensing and Information Processing, 2005., Chennai, India, 2005, pp. 228-233, doi: 10.1109/ICISIP.2005.1529453. (Year: 2005).*

Google Patents English Language Translation of CN 120320399 A. https://patents.google.com/patent/CN120320399A/en?oq=CN+120320399+A (Year: 2025).*

A. Ravi, L. Bai, F. Ding and H. Wang, "Multi-Edge Graph Convolutional Networks for Power Systems," 2024 IEEE Texas Power

(56) References Cited

OTHER PUBLICATIONS and Energy Conference (TPEC), College Station, TX, USA, 2024, pp. 1-6, doi: 10.1109/TPEC60005.2024.10472223. (Year: 2024).*

R. Yan, Q. Xing and Y. Xu, "Multi-Agent Safe Graph Reinforcement Learning for PV Inverters-Based Real-Time Decentralized Volt/Var Control in Zoned Distribution Networks," in IEEE Transactions on Smart Grid, vol. 15, No. 1, pp. 299-311, Jan. 2024, doi: 10.1109/TSG.2023.3277087. (Year: 2024).*

H. Peng, K. Liao, J. Yang, B. Pang and Z. He, "Deep Reinforcement Learning Based Multi-Timescale Volt/Var Control in Distribution Networks Considering Network Reconfiguration," in IEEE Transactions on Sustainable Energy, vol. 16, No. 4, pp. 2948-2958, Oct. 2025, doi: 10.1109/TSTE.2025.3574806. (Year: 2025).*

P. Dolatyabi and M. Khodayar, "Graph Neural Networks and Their Applications in Power Systems: A Review," 2025 IEEE International Conference on Electro Information Technology (eIT), Valparaiso, IN, USA, 2025, pp. 1-10, doi: 10.1109/eIT64391.2025.11103635. (Year: 2025).*

Yuanqi Gao et al. "Consensus Multi-Agent Reinforcement Learning for Volt-VAR Control in Power Distribution Networks"; IEEE Transactions on Smart Grid, vol. 12, No. 4, Jul. 2021' 1949-3053; 2021 IEEE. Personal use is permitted, but republication/redistribution requires IEEE permission; See https://www.ieee.org/publications/rights/index.html for more information. / Jul. 4, 2021.

Kipf, N. Thomas et al: "Semi-Supervised Classification with Graph Convolutional Networks"; ICLR 2017; Feb. 22, 2017 (Feb. 22, 2017), XP055457092 / Feb. 22, 2017.

Ying Zhang, et al. "Deep Reinforcement Learning Based Volt-VAR Optimization in Smart Distribution Systems"; 2019.

Wei Wang et al. "Safe Off-Policy Deep Reinforcement Learning Algorithm for Volt-VAR Control in Power Distribution Systems"; IEEE Transactions on Smart Grid, vol. 11, No. 4, Jul. 2020 / Jul. 4, 2020.

* cited by examiner

300

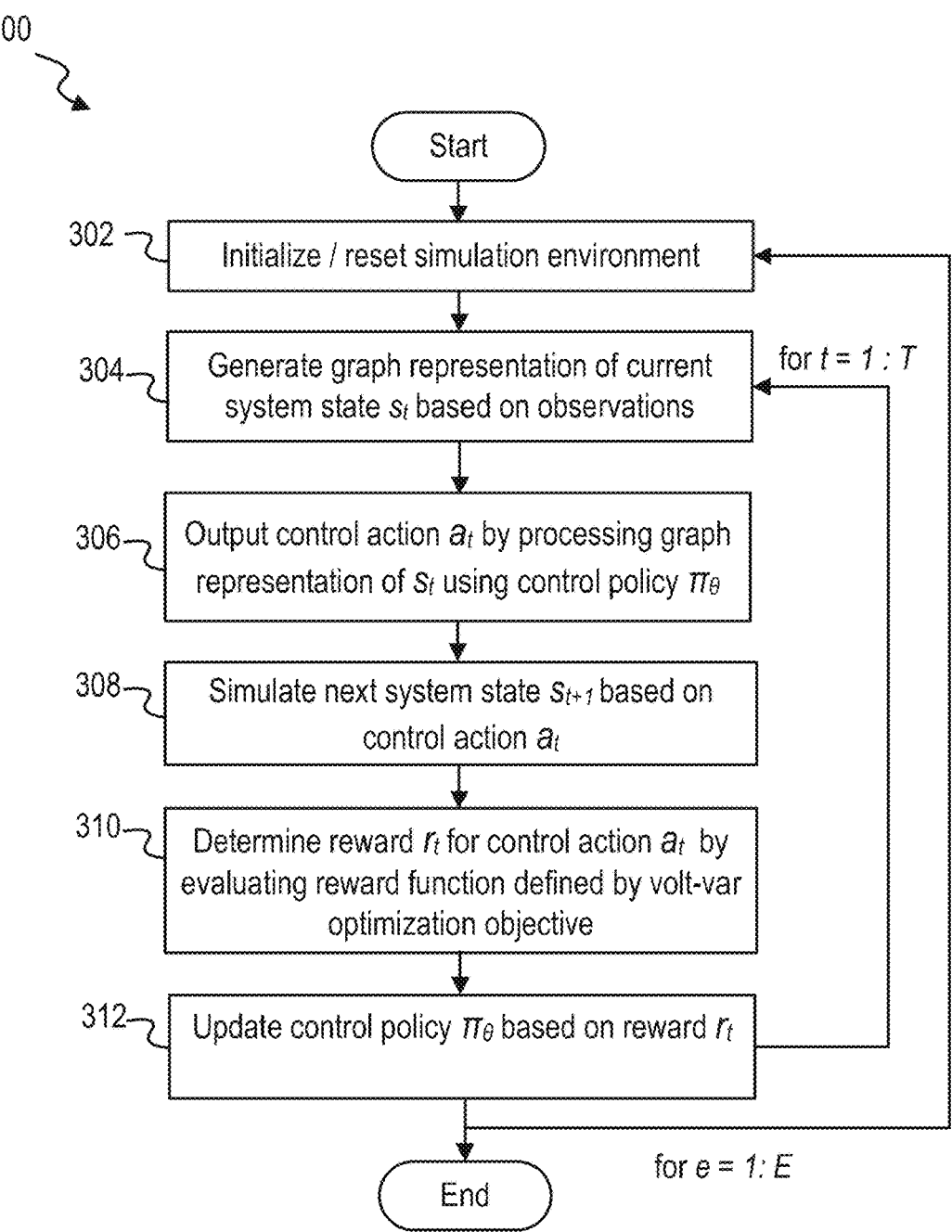

Start

302 — Initialize / reset simulation environment

304 — Generate graph representation of current system state $s_t$ based on observations for $t = 1 : T$ 306 — Output control action $a_t$ by processing graph representation of $s_t$ using control policy $\pi_\theta$ 308 — Simulate next system state $s_{t+1}$ based on control action $a_t$ 310 — Determine reward $r_t$ for control action $a_t$ by evaluating reward function defined by volt-var optimization objective 312 — Update control policy $\pi_\theta$ based on reward $r_t$ End for $e = 1 : E$ $E$ = Number of episodes
$H$ = Number of steps in an episode

FIG. 3

Processor(s) 710

Machine-Readable Medium 720

State Graph Generating Instructions 722

Volt-Var Control Instructions 724

Computing System 700

SYSTEM AND METHOD FOR CONTROLLING POWER DISTRIBUTION SYSTEMS USING GRAPH-BASED REINFORCEMENT LEARNING

TECHNICAL FIELD

The present disclosure relates, in general, to control of power distribution systems to achieve voltage regulation. Disclosed embodiments relate to systems, methods and computer program products for controlling voltage and reactive power flow in power distribution systems using graph-based reinforcement learning.

BACKGROUND

Circuits in power distribution systems usually follow a radial topology, which may cause nodes that are far away from the substation (root node) to experience undervoltage. For example, voltage at the end of a feeder may drop below the acceptable range of ±5% of nominal the nominal voltage. Active control of voltage and reactive power flow may be desirable for maintaining healthy operation of power distribution systems.

Volt-var control refers to the control of voltage (Volt) and reactive power (Var) in power distribution systems. Volt-var control usually involves optimally dispatching controllable grid assets or actuators of a power distribution system to maintain voltage profile at the nodes as well as reduce power losses across the power distribution system.

SUMMARY

Briefly, aspects of the present disclosure provide a technique for volt-var control in power distribution systems using graph-based reinforcement learning.

A first aspect of the disclosure provides a method for controlling a power distribution system comprising a number of nodes and controllable grid assets associated with at least some of the nodes. The method comprises acquiring observations via measurement signals associated with respective nodes. The method further comprises generating a graph representation of a system state of the power distribution system based on the observations and topological information of the power distribution system. The the topological information is used to determine edges defining connections between nodes and the observations are used to determine nodal features of respective nodes. The nodal features are indicative of a measured electrical quantity and a status of controllable grid assets associated with the respective node. The method further comprises processing the graph representation of the system state using a control policy trained by reinforcement learning to output a control action for effecting a change of status of one or more of the controllable grid assets, to regulate voltage and reactive power flow in the power distribution system based on a volt-var optimization objective.

A further aspect of the disclosure provides a computer-implemented method for training a control policy using reinforcement learning for volt-var control in a power distribution system according to the above-described method.

Other aspects of the disclosure implement features of the above-described method in systems and computer program products for volt-var control in a power distribution system.

Additional technical features and benefits may be realized through the techniques of the present disclosure. Embodiments and aspects of the disclosure are described in detail herein and are considered a part of the claimed subject matter. For a better understanding, refer to the detailed description and to the drawings.

BRIEF DESCRIPTION OF THE DRAWINGS

The foregoing and other aspects of the present disclosure are best understood from the following detailed description when read in connection with the accompanying drawings. To easily identify the discussion of any element or act, the most significant digit or digits in a reference number refer to the figure number in which the element or act is first introduced.

FIG. 3 is a flowchart of an example logic for training a control policy for volt-var control via graph-based reinforcement learning.

DETAILED DESCRIPTION

Figure 1:
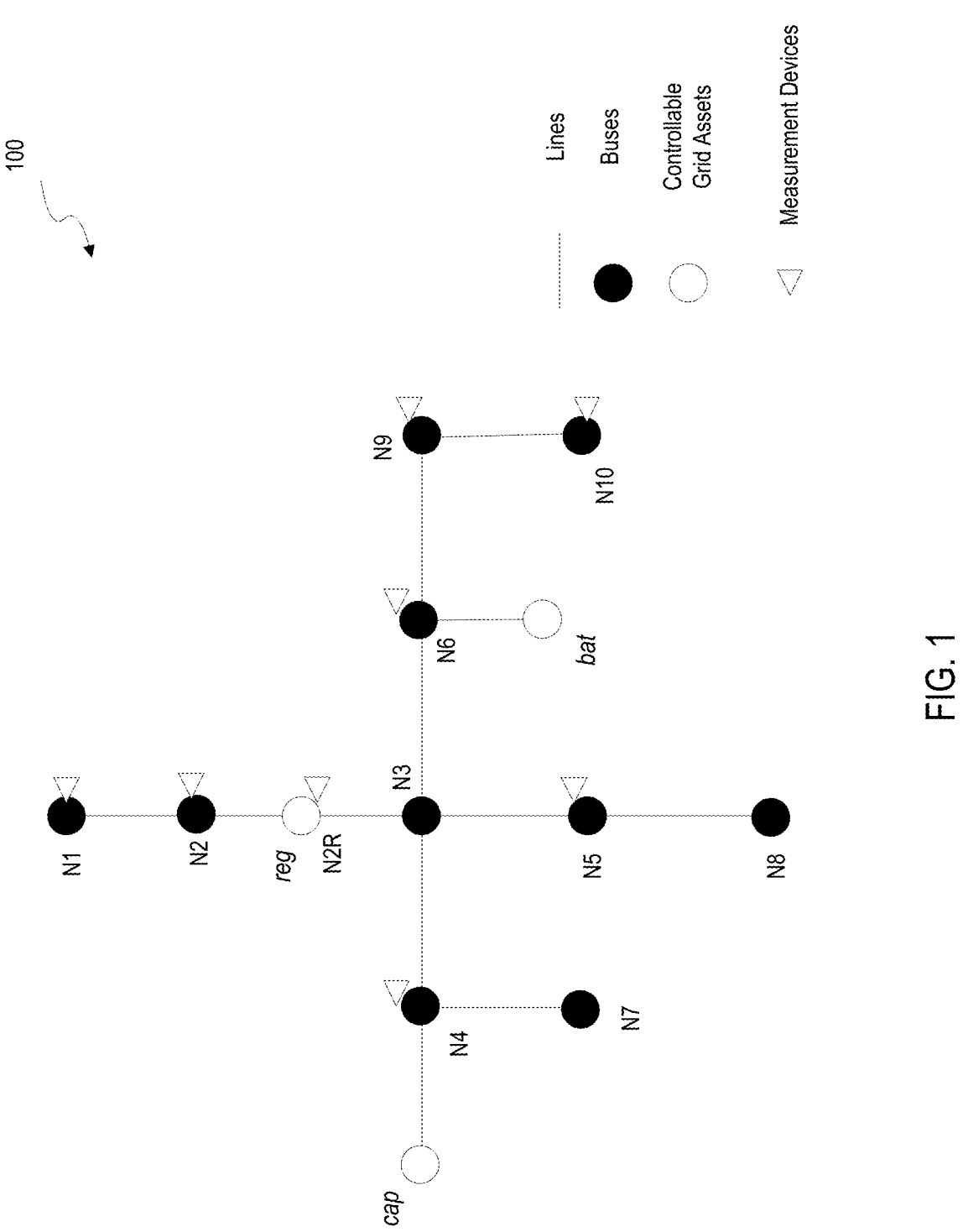
FIG. 1 illustrates an example topology of a power distribution system having controllable grid assets for controlling voltage and reactive power flow.

Volt-var control involves operating a power distribution system via controlling voltage and reactive power flow to maintain healthy operation of the power distribution system. In particular, volt-var control may be implemented to optimize the operation of controllable grid assets to minimize power delivery losses as well as maintain the voltage profile at each bus or node of the power distribution system.

In the context of the present description, a "controllable grid asset" or "actuator" refers to a device or component of a power distribution system that is controllable to switch between multiple discrete or continuous states, to regulate voltage and/or reactive power flow in the power distribution system. The present description considers three types of controllable grid assets, namely, voltage regulators, capacitors and batteries. A voltage regulator may be considered as a switchable transformer operable in multiple states, defined by a tapping number. By changing the tapping number (i.e., by adjusting the output side voltage), a voltage difference between nodes connected to the input side and the output side of the voltage regulator may be adjusted. A capacitor can function as a storage for reactive power. Switching ON a capacitor from an OFF state may increase reactive power flow and bring up voltage profiles. A battery can be used for power management on the load side, for example, for compensating for large loads. Depending on the construction, a battery may have discrete or continuous switchable states.

A power distribution system may comprise one or more of each of the above-described types of controllable grid assets, among other types of devices, for implementing volt-var control. The operational change of any single grid asset may potentially result in a change over the entire power distribution system. Thus, at the center of the volt-var control is an optimization for voltage profiles and power losses governed by physical constraints of the power distribution system.

The volt-var control problem can be formulated as an optimum power flow (OPF) problem that involves optimization of an objective function subject to the physical constraints. The objective function is referred to herein as a "volt-var optimization objective." With the primary goal being voltage regulation, the volt-var optimization objective may typically include a cost for voltage violation at nodes. According to disclosed embodiments, the volt-var optimization objective may be defined by a combination of costs, represented below as:

$$\min_{x:\{P_{bat}, TapNum_{reg}, Status_{cap}\}} f_{volt}(x) + f_{ctrl}(x) + f_{power}(x) \qquad (1)$$

In equation (1), $f_{volt}$ is a cost for voltage violation at nodes, $f_{power}$ is a cost for power losses, and $f_{ctrl}(x)$ is a cost for control error pertaining to frequency of change of status of the controllable grid assets (actuators), to prevent actuator wear out by penalizing the actuator status from changing too frequently. In this problem, three different types of actuators are considered, namely voltage regulators (reg), capacitors (cap) and batteries (bat). The battery state or discharge power $P_{bat}$ may be defined by a real number, the capacitor state $Status_{cap}$ may be defined by a discrete variable (ON or OFF) and the regulator tapping number $TapNum_{reg}$ may be defined by an integer value.

The volt-var optimization objective, for example as defined above, may be subject to a set of passive constraints that may be governed by the physics of power propagation in the network, as well as active constraints for controlling voltage. The power distribution system may be represented as a radial graph (N, ξ), where N is the set of nodes or buses and ξ is the set of edges defined by lines, transformers and voltage regulators. Denoting node i as j's parent (radial graph is a tree), the constraints may be defined as:

$$p_j = p_{ij} - R_{ij}\ell_{ij} - \sum_{(j,k)\in\xi} p_{jk} + \sum_{m\in j} p_{bat}^m \qquad (2a)$$

$$q_j = q_{ij} - X_{ij}\ell_{ij} - \sum_{(j,k)\in\xi} q_{jk} + \sum_{n\in j} q_{cap}^n \qquad (2b)$$

$$v_j^2 = \begin{cases} rv_i^2 & \text{if } (i,j) \text{ is reg} \\ v_i^2 - 2(R_{ij}p_{ij} + X_{ij}q_{ij}) + (R_{ij}^2 + X_{ij}^2)\ell_{ij}, & \text{otherwise} \end{cases} \qquad (2c)$$

$$\ell_{ij} = \left(p_{ij}^2 + q_{ij}^2\right)/v_i^2 \qquad (2d)$$

$$P_{bat}, TapNum_{reg}, Status_{cap} \in s \qquad (2e)$$

In the above equations, p, q denote active and reactive power consumed at buses (nodes) or power flow over lines (edges), v, ℓ denote nodal voltage magnitude and squared current magnitude, and R, X denote resistance and reactance. All $\{P_{bat}, TapNum_{reg}, Status_{cap}\}$ need to be operating under their operational constraints captured by a set S. The top portion of equation (2c) defines an active constraint while the remaining constraint equations define passive constraints. Note that the volt-var control problem is a time-dependent problem, but for brevity, time t has been omitted in all the variables. The constraints in equations (2a) to (2e) include quadratic equalities, making any optimization upon it non-convex.

State-of-the-art methods have leveraged optimization solvers to solve the OPF problem for volt-var control. However, as seen above, due to the nature of an OPF problem, the resulting optimization problem may be non-convex and thus hard to solve. Together with many integer decision variables in controllable devices not discussed above, the volt-var control problem can become extremely hard to scale to a system with thousands of buses, which is a typical size for power distribution systems.

The disclosed methodology attempts to solve the volt-var control problem by leveraging a control policy trained using reinforcement learning (RL). It is recognized that a power distribution system has no memory and the system's transition into the next state may be solely dependent on the control action and current state. Hence, according to the disclosed methodology, the volt-var control problem can be cast as an MDP and solved using RL, where the volt-var optimization objective (e.g., see equation (1)) may be used to define the reward function in the RL framework. The disclosed methodology can thus address at least some of the above-mentioned technical challenges of the OPF problem.

A key feature of the disclosed methodology is to use a RL control policy that can process a graph representation of system state to predict a control action. A graph representation can provide the decision-making control policy with a much more consistent state representation. According to the disclosed methodology, the system state, which is defined by observations (nodal measurement signals) from the power distribution system, may be converted into a graph representation by incorporating known topological information of the power distribution system. The observations may be used to determine nodal features of the graph and the topological information may be used to determine edges between nodes. The nodal features may be indicative of a measured electrical quantity (e.g., voltage and/or power) and a status of controllable grid assets associated with the respective node. The graph representation of the system state may be processed by the RL control policy to output an optimal control action. The control action may effect a change of status of one or more of the controllable grid assets, to regulate voltage and reactive power flow in the power distribution system based on the volt-var optimization objective.

Consistent with disclosed embodiments, the RL control policy may include a graph neural network. A graph neural network-based RL control policy can enable robust control actions in situations where observations such as voltage measurements may be missing or noisy. This technical effect may be attributed to the message-passing mechanism of the graph neural network architecture. Note that in physical power distribution systems, neighboring nodes often have similar values of voltage or other measured electrical quantities. When voltage observations of any nodes are missing or noisy, the graph neural network architecture can enable the information of neighboring nodes to naturally fill in the missing values or smoothen out the noisy values to generate a much more accurate overall state representation (without learning spurious correlations among non-connected nodes, such as in a dense neural network architecture).

Additionally, the knowledge learnt by the RL control policy, for example, represented as the weights of the graph neural network, can also be leveraged to accelerate the training of new controllers for other systems/topology via transfer learning. This can solve the problem of re-training a new controller from scratch for every topological change or update to the power distribution system (e.g., a new connection between nodes or placement of new grid assets).

Furthermore, a graph neural network-based RL control policy may be agnostic of the power distribution system's size, thus enabling the transfer of knowledge from previously trained controllers. In contrast, RL controllers using dense neural networks may not be transferrable to power system of different sizes since the dimensionality of the input state representation will differ.

Turning now to the disclosed embodiments, FIG. 1 illustrates a topology of a power distribution system 100. The shown power distribution system 100 is merely illustrative. The disclosed methodology can be scaled to large distribution systems having a large number (e.g., thousands) of buses. The shown power distribution system 100 includes 10 buses that define nodes N1, N2, N3, N4, N5, N6, N7, N8, N9, N10 arranged in a radial topology having a root node (source bus) N1. The shown power distribution system 100 further includes a number of controllable grid assets or actuators associated with at least some of the nodes. These actuators include a capacitor (cap) connected to node N4, a battery (bat) connected to node N6 and a voltage regulator (reg) defining an edge between nodes N2 and N3. Here, the output side of the voltage regulator (reg) is represented as a special node N2R. For the purpose of this description, the voltage regulator (reg) may be considered to be associated with the node N2R.

The power distribution system 100 may include measurement devices or sensors associated with at least some of the nodes for acquiring observations pertaining to the respective nodes. These nodes are referred to as "measured nodes." The measurement devices can include, for example, smart metering infrastructure (SMI) devices, among others. The power distribution system 100 may also include one or multiple "unmeasured nodes" from which measurement signals are missing, for example, due to failure or unavailability of measurement devices (e.g., nodes N3, N7 and N8).

Figure 2:
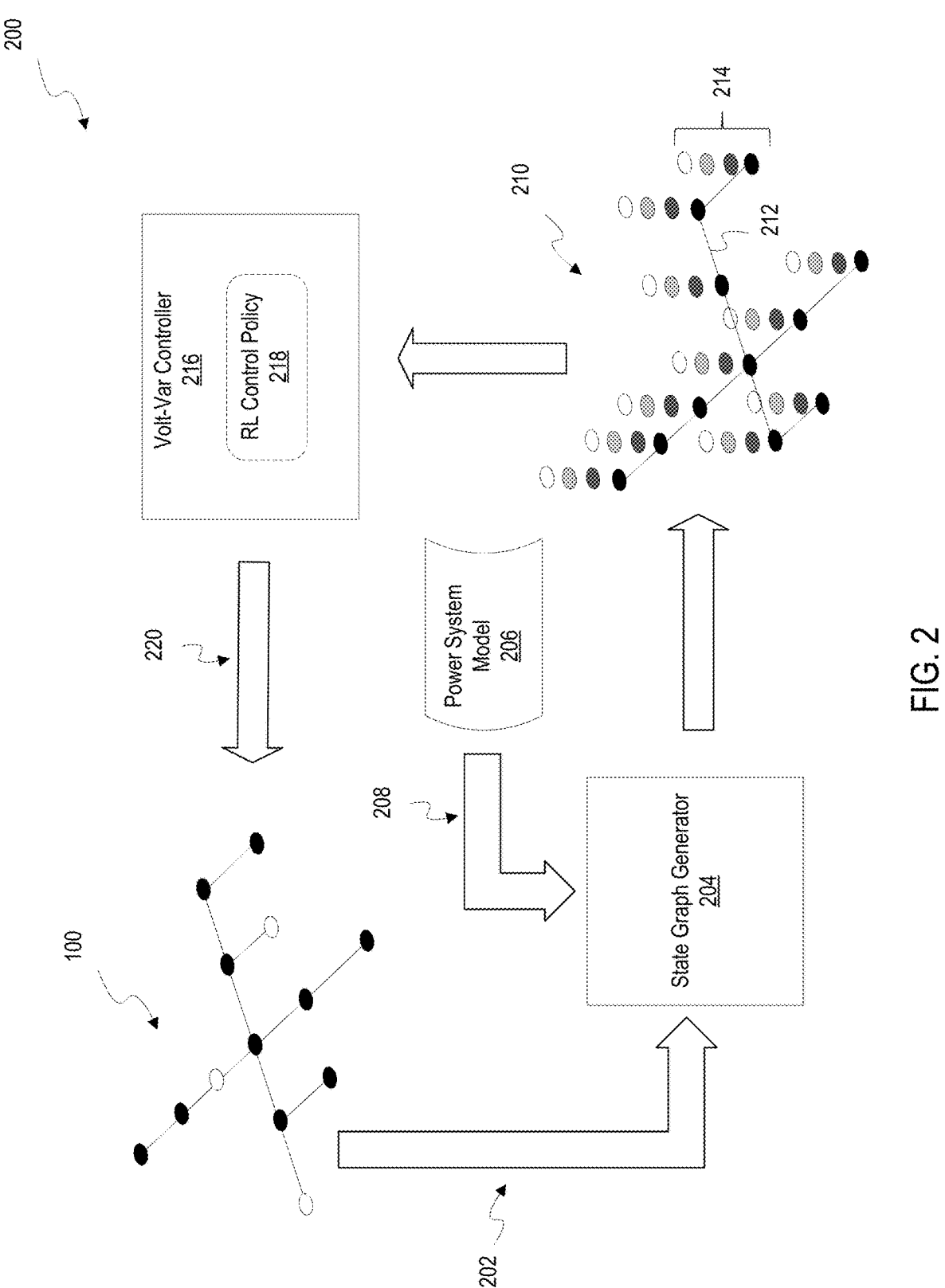
FIG. 2 is a schematic illustration of a system for controlling voltage and reactive power flow in a power distribution system using graph-based reinforcement learning, according to an example embodiment.

FIG. 2 illustrates an example embodiment of a system 200 for controlling voltage and reactive power flow in a power distribution system 100 using graph-based reinforcement learning. The various engines described herein, including the state graph generator 204 and the volt-var controller 216, including components thereof, may be implemented by a computing system in various ways, for example, as hardware and programming. The computing system may, for example, be part of a grid control system. The programming for the engines 204, 216 may take the form of processor-executable instructions stored on non-transitory machine-readable storage mediums and the hardware for the engines may include processors to execute those instructions. The processing capability of the systems, devices, and engines described herein, including the state graph generator 204 and the volt-var controller 216 may be distributed among multiple system components, such as among multiple processors and memories, optionally including multiple distributed processing systems or cloud/network elements.

Referring to FIG. 2, measurement signals 202 associated with respective nodes of the power distribution system 100 may be communicated via measurement devices, such as SMIs (e.g., as shown in FIG. 1). A state graph generator 204 may be used to construct a graph representation 210 of a system state of the power distribution system 100 based on observations acquired via the measurement signals 202 using topological information 208 of the power distribution system 100. The topological information 208 may be obtained, for example, from a power system model 206 of the power distribution system 100. According to disclosed embodiments, the graph representation 210 may include an undirected and unweighted graph. The topological information 208 may be used to determine edges 212 of the graph 210 that define connections between nodes. The observations may be used to determine nodal features 214 of respective nodes. The nodal features 214 may be indicative of a measured electrical quantity (in this example, a nodal voltage) and a status of actuators associated with the respective node.

The nodal features 214 may be assigned to every node of the power distribution system 100. According to disclosed embodiments, the nodal features 214 may include the nodal voltage as well as capacitor, voltage regulator and battery status. Computationally, the nodal features 214 for each node may be represented as a corresponding node vector. Nodes that do not have capacitors, voltage regulators or batteries may be padded with zeros indicative of "absent" status in the corresponding entries in the node vector. The measurement signals 202 may typically comprise time series data. The nodal features 214 of each node may represent a snapshot or instantaneous data samples from the time series data acquired from that node.

The nodal features 214 may define an observation space which is a product of discrete and continuous variables. The discrete variables may be from the physical constraints of the actuators. For example, a capacitor may be operable only in an ON or an OFF state; a voltage regulator may be operable in a finite number of modes or tapping numbers (typical example is 33 tapping numbers); a discrete battery may be operable in a finite number of discharge powers. The continuous variables may include, for example, the measured nodal voltage, state-of-charge of the battery and (in some examples) discharge power of a continuous battery.

Figure 5:
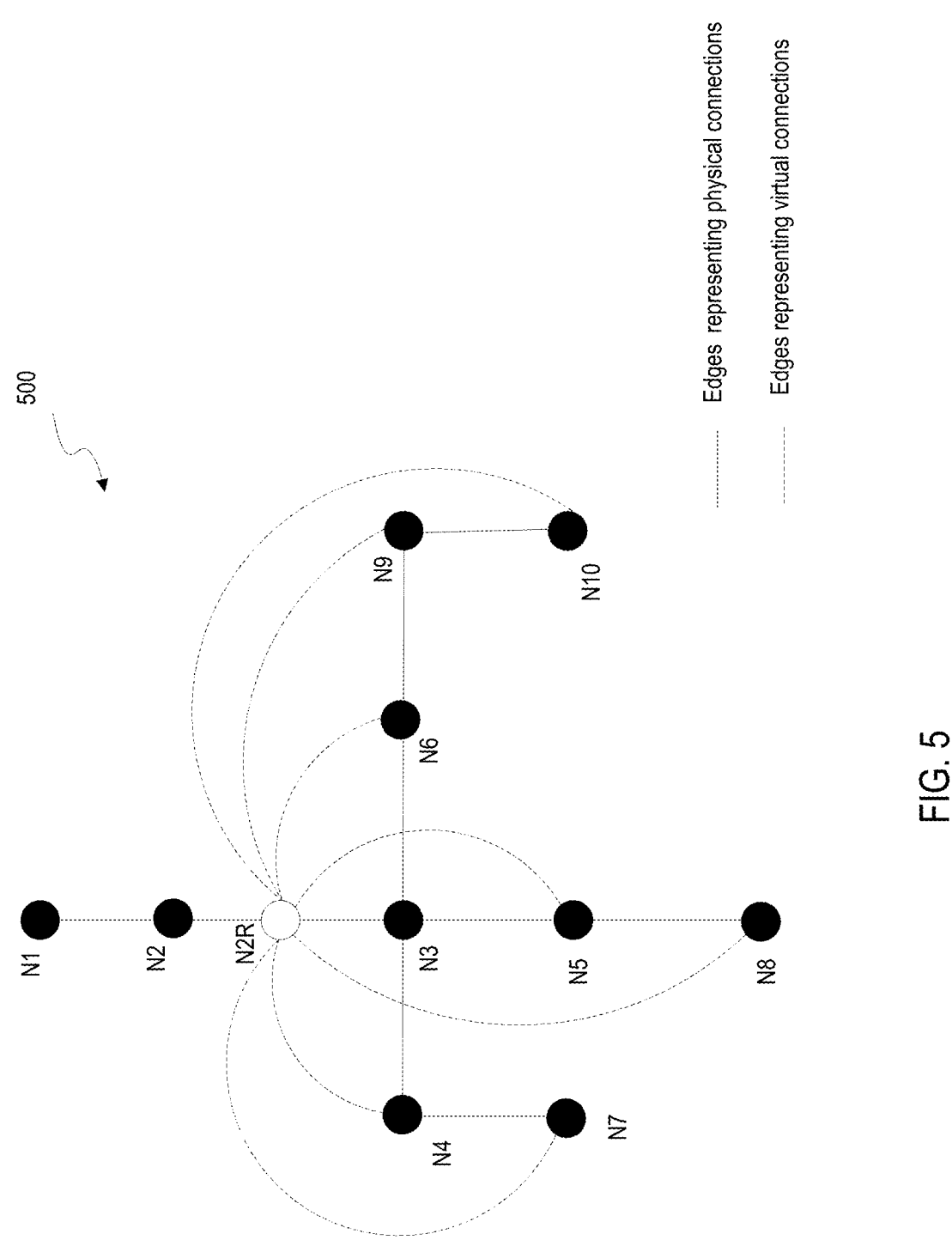
FIG. 5 is a schematic illustration of an augmented graph representation to take into account global effects of a controllable grid asset.

In one embodiment, as shown in FIG. 2, the edges 212 of the graph 210 may represent only actual physical connections (e.g., lines, transformers, etc.) between the nodes. In a further embodiment (e.g., as shown in FIG. 5), the graph may be augmented to include additional edges that represent virtual connections that can take into account global effects of certain actuators.

The graph representation 210 may be sent as input to a volt-var controller 216. The volt-var controller 216 may process the input graph representation 210 using a trained RL control policy 218 to output a control action for effecting a change of status of one or multiple actuators, to regulate voltage and reactive power flow in the power distribution system 100 based on the defined volt-var optimization objective. The output control action may be predicted from an action space defined by switchable states of all the actuators of the power distribution system 100.

Based on the control action output by the RL control policy 218, the volt-var controller 216 may communicate control signals 220 to respective actuators of the power distribution system 100 to effect a change of status thereof, whereby the power distribution system 100 may transition to a new system state. Volt-var control of the power distribution system 100 may thus be implemented by continuously executing the above-described process over a sequence of time steps (e.g., every 1 hour) where the system state of the power distribution system 100 may be transformed after the control action at each step.

The control policy 218 may be trained via a process of reinforcement learning. The process can include, over a number of episodes of trial, optimizing trainable parameters (e.g., weights) of the control policy 218 to maximize a cumulative reward resulting from a sequence of control actions for each episode, based on a reward function r defined by the volt-var optimization objective. The objective of the RL algorithm can be defined as below:

$$\max_{\theta} \sum_{t=0}^{T} r(s_t, a_t, s_{t+1}) \text{ s.t. } s_{t+1} = f(s_t, a_t), a_t \sim \pi_\theta(s_t) \quad (3)$$

In equation (3), r denotes the reward function, T denotes the horizon or number of steps in an episode, and $f(s_t, a_t)$ denotes the underlying environmental dynamics which transitions the system into the next state $s_{t+1}$ according to the current state $s_t$ and action $a_t$, based on physical constraints such as defined by equations (2a) to (2e). The control policy $\pi_\theta(s_t)$ is parametrized by trainable parameters $\theta$, such that $a_t \sim \pi_\theta(s_t)$.

According to disclosed embodiments, the reward function r may take the form:

$$r = -(r_v + r_c + r_p) \quad (4)$$

In equation (4), $r_v$ denotes the penalty or cost for voltage violation at nodes, $r_c$ denotes the penalty or cost for control error due to frequently changing the status of actuators and $r_p$ denotes the penalty or cost for power losses. The penalty terms in equation (4) map back to the costs in the volt-var optimization objective in equation (1). The terms $r_v$ and $r_c$ may be conflicting in practice. Minimizing the voltage violation $r_v$ may require frequent operation of voltage regulators, capacitors, and batteries, which would subsequently increase the control error penalty $r_c$, and vice versa. This may result in a multi-objective RL scenario. The reward function may include weights associated with the penalty terms. According to disclosed embodiments, the weights (e.g., $w_{rap}$, $w_{reg}$, $w_{bat}$, $w_{soc}$ and $w_{power}$) may be built into individual penalty terms, as described below.

The penalty $r_v$ for voltage violation may be determined, for example, as a sum of worst-case voltage violations among all phases across all nodes of the power distribution system. The upper/lower voltage violation thresholds $(\overline{V}/\underline{V})$ may be set as ±5% of the nominal voltage V. The penalty $\overline{r}_v$ may be thus determined as:

$$r_v = \sum_{n \in N} \left( \max_{p \in Phases(n)} V_{n,p}(s_{t+1}) - \overline{V} \right)_+ + \left( \underline{V} - \min_{p \in Phases(n)} V_{n,p}(s_{t+1}) \right)_+ \quad (5)$$

In equation (5), $(\cap)_+$ is a shorthand for max(•, 0). Thereby, the upper violation $(\max_p V_{n,p} - \overline{V})$ is positive when $\max_p V_{n,p} > \overline{V}$ and zero otherwise.

The penalty $r_c$ for control error may be determined, for example, as a sum of the capacitors' and regulators' switching penalties (1st & $2^{nd}$ rows of equation (6) respectively) and batteries' discharge penalty and state-of-charge (soc) penalty (3rd row of equation (6)). The penalty $r_c$ can discourage the control policy from making frequent changes and slow the actuators from wear out. The penalty $r_c$ may be thus determined as:

$$r_c = \sum_{c \in caps} w_{cap} \left| Status_{cap}(s) - Status_{cap}(s_{t+1}) \right| + \quad (6)$$

$$\sum_{r \in regs} w_{reg} \left| TapNum_{reg}(s) - TapNum_{reg}(s_{t+1}) \right| +$$

$$\sum_{b \in bats} w_{dis} \frac{P_{bat}(s_{t+1})_+}{\overline{P_{bat}}} + w_{soc} I_{i=T} \left| soc_{bat}(s_{t+1}) - soc0_{bat} \right|$$

In equation (6), $$\frac{P_{bat}(s_{t+1})_+}{\overline{P_{bat}}}$$

represents a discharge error with $\overline{P_{bat}}$ being the max power and having a $(•)_+$ function as the battery degradation is primarily caused by the battery discharging power $P_{bat} > 0$. Besides, the soc penalty has an indicator of the last time step $I_{ti=T}$ to encourage the battery to return to its initial state-of-charge $soc0_{bat}$. Hence, the reward is stationary if $w_{soc} = 0$ and non-stationary otherwise.

The penalty $r_p$ for power losses may be determined, for example, as a ratio of the overall power loss to the total power, given by:

$$r_p = w_{power} \frac{PowerLoss(s_{t+1})}{TotalPower(s_{t+1})} \quad (7)$$

FIG. 3 shows an example logic 300 for training a control policy for volt-var control via graph-based reinforcement learning. The logic 300 may be implemented on a simulation environment using a simulation model of the power distribution system 100. Thus, the "system states" processed by the logic 300 refer to simulated system states. To execute the logic 300, hyperparameters may first be defined. According to disclosed embodiments, the hyperparameters may include the number of episodes E, the horizon T of an episode, and the weights of the reward function $w_{cap}$, $w_{reg}$, $w_{bat}$, $w_{soc}$ and $w_{power}$ in equations (6) and (7)). Having defined the hyperparameters, the logic 300 may include executing E episodes of trial, with each episode including executing blocks 304 through 312 over T steps. The logic 300 is illustrated using a step counter t and an episode counter e.

At block 302, at the start of each episode, the simulation environment may be initialized or reset to return an initial observation. The initialization may comprise reading a load profile into the simulation model and setting initial statuses of the actuators. For example, the capacitors, regulators, and batteries may be initialized with the status "ON", "full tap number" and full charge with zero discharge power respectively.

At block 304, observations may be acquired via measurement signals read from the simulation model. Based on the observations, a state graph generator may construct a graph representation of a current system state $s_t$ using the topological information of the power distribution system.

As described above, the topological information may be used to determine edges defining connections between nodes and the observations may be used to determine nodal features of respective nodes. The nodal features may be indicative of a measured electrical quantity, such as nodal voltage and/or power, and a status of actuators associated with the respective node.

At block 306, the graph representation of the current system state $s_t$ may be processed using the control policy $\pi_\theta$ to output a control action $a_t$, which can result in a transition to a next system state. The control action may be predicted from an action space defined by switchable states of the actuators.

The action space of the control policy $\pi_\theta$ may be defined by the switchable states of all the actuators in the power distribution system, where each actuator can be controlled with independent and potentially different actions. That is, the control action predicted by the control policy $\pi_\theta$ at any step may change the state of any of, or all of, or any combination of the actuators. According to disclosed embodiments, the action space may comprise the switchable states (ON or OFF) of all the capacitors, the switchable states or tapping numbers of all the voltage regulators and the switchable states of discharge power of all of the batteries. As mentioned above, capacitors and voltage regulators typically have discrete switchable states while batteries may have either discrete or continuous states of discharge power depending on their construction. Thus, depending on the physical constraints of the actuators, the action space may be a multi-discrete action space or a product of multi-discrete and continuous spaces.

At block 308, a next system state $s_{t+1}$ may be simulated based on the control action $a_t$ using the simulation model.

At block 310, a reward $r_t$ may be determined for the control action $a_t$ by evaluating the reward function r, which is defined based on the volt-var optimization objective. According to disclosed embodiments, the reward function r may be evaluated using equations (4) to (7).

At block 312, the control policy $\pi_\theta$ may be updated by adjusting the trainable parameters $\theta$ based on the reward $r_t$.

The logic 300 may employ any suitable RL algorithm for optimizing trainable parameters $\theta$ of the control policy $\pi_\theta$ to maximize a cumulative reward resulting from the sequence of control actions for each episode. According to disclosed embodiments, the RL algorithm may include an actor-critic algorithm or a proximal policy optimization (PPO) algorithm. These algorithms can be particularly suitable for continuous action spaces, such as described above. However, depending on the application, various other types of RL algorithms, such as value-based or policy-based algorithms may be suitably employed.

According to disclosed embodiments, the control policy may include a graph neural network, for generating nodal embeddings of respective nodes based on the observations and the topological information using a mechanism of message-passing between neighboring nodes. The output control action may be predicted based on the nodal embeddings.

Graph neural networks (GNN) are a special class of neural networks designed to learn from graph-structured data by capturing the relationship between different nodes. A GNN may be utilized to learn embeddings for nodes of an input graph using a message-passing mechanism, where the features of a node in the graph may be aggregated based on the features of neighboring nodes, using some trainable parameters (e.g., weighs, biases) for transforming the messages. Depending on the downstream application at hand, the learned nodal embeddings may be further aggregated and/or sent through a readout function to an output layer for outputting a final prediction. In one suitable implementation as described below, a specific type of GNN architecture referred to as graph convolutional network (GCN) may be used to represent the control policy $\pi_\theta$.

Figure 4:
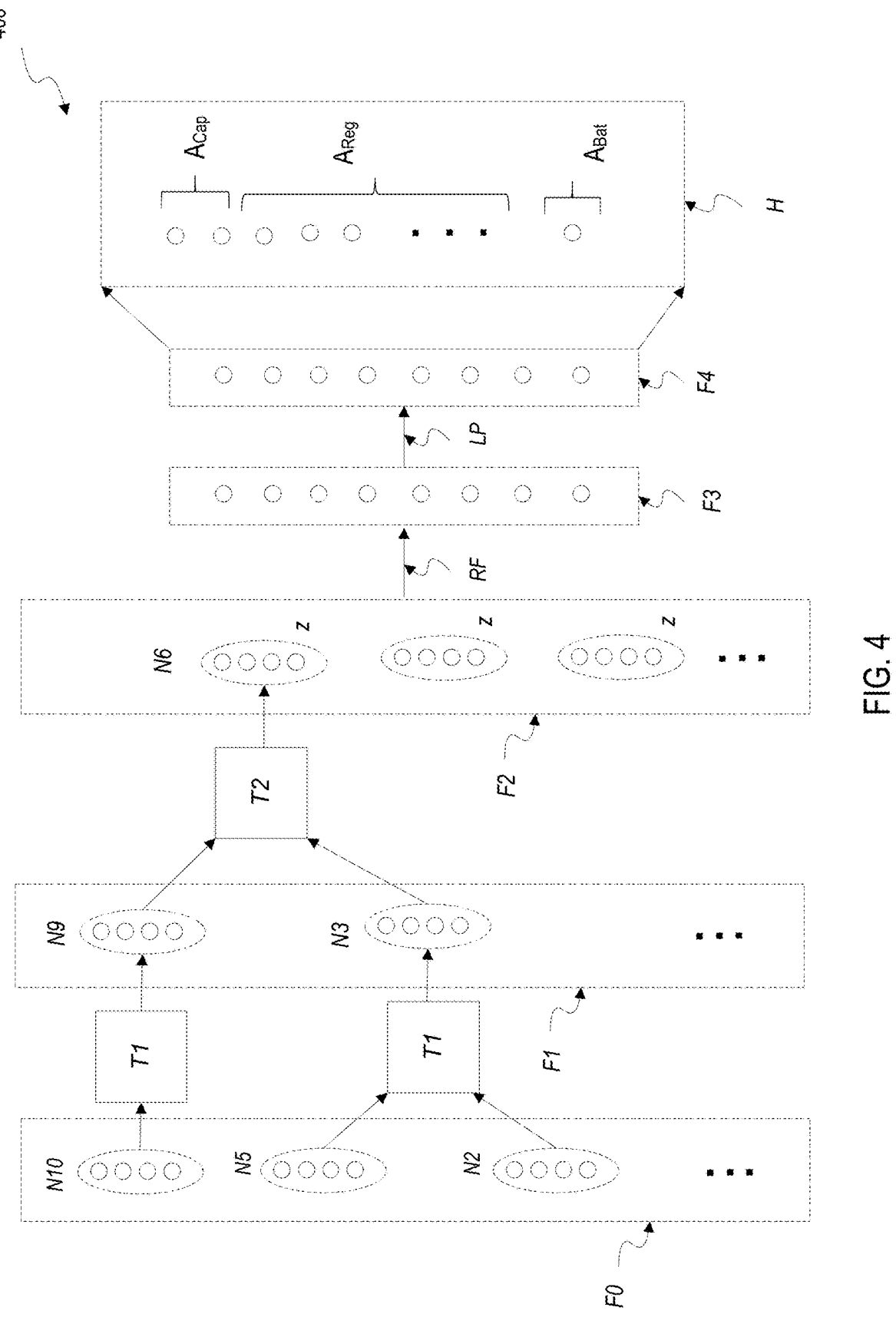
FIG. 4 is a schematic illustration of a control policy including a graph neural network, according to an example embodiment.

FIG. 4 illustrates a policy network 400 including a GCN according to an example embodiment. The GCN may comprise a neural network structure for each target node z defined by a local neighborhood of the node z in the graph representation. The GCN may have a depth or number of layers corresponding to the number hops information is propagated along. In the illustrated example, the number of hops is 2.

The representation shown in FIG. 4 specifically illustrates how nodal embeddings may be generated for the target node N6, based on a 2-hop neighborhood of the node N6. Nodal embeddings for other nodes may be generated in a similar manner. As seen from FIG. 1, the node N6 has N9 and N3 as its neighboring nodes. N9 and N3 thus define the first hop with respect to the target node N6. The node N9 has N10 as its neighboring node, while the node N3 has N2 and N5 as its neighboring nodes. Thus, N10, N5 and N2 define the second hop with respect to the target node N6.

Continuing with reference to FIG. 4, a feature representation of the respective nodes may be determined at each layer. At the input layer 402, the feature representation F0 of each node may comprise the respective nodal features of the graph representation determined using the observations from the physical power distribution system. At each subsequent layer, the feature representation of each node may be determined by aggregating messages (feature representations) passed from its neighboring nodes and itself in the previous layer via respective edges. The aggregated message may be transformed using trainable parameters including weights and biases of that layer and applying a non-linearity function to obtain the feature representation at the given layer.

Thus, at the first or intermediate layer of the GCN, the feature representation F1 for nodes N9 and N3 may be obtained by aggregating messages passed from their respective neighboring nodes and transforming these messages via a transformation unit T1, which may use trainable parameters (e.g., weights and biases) of the first layer and a non-linearity function (e.g., ReLU). Likewise, at the second or final layer of the GCN, the feature representation F2 for the target node N6 may be obtained by aggregating messages passed from its neighboring nodes via a transformation unit T2, which may use trainable parameters (e.g., weights and biases) of the second layer and a non-linearity function (e.g., ReLU). The feature representation F2 of respective nodes at the final layer are referred to herein as "nodal embeddings."

For a detailed mathematical formulation of the feature representations in a GCN, the reader may refer to the publication: Thomas N Kipf and Max Welling. Semi-supervised classification with graph convolutional networks. arXiv preprint arXiv:1609.02907, 2016.

In many embodiments, the power distribution system may include unmeasured nodes from which measurement signals are missing, for example, due to failure or unavailability of measurement devices. In this scenario, the nodal features of the unmeasured nodes may consist of "zeros" in certain fields of the input node vector. The GNN architecture may enable nodal embeddings of the unmeasured nodes to be generated based on observations from neighboring measured nodes using the message passing mechanism. The message passing mechanism of the GNN architecture may also smoothen noisy observations to generate consistent nodal embeddings. A GNN architecture may thereby provide a highly robust control policy in a situation when observations (e.g., voltage readings) may be missing or noisy.

Still referring to FIG. 4, the nodal embeddings F2 in the final GNN layer may be processed by a readout function RF to form a state representation F3 having a reduced dimensionality. In an example embodiment, the readout function may include a mean-pool readout function to average the nodal embeddings of all the nodes from the final GNN layer to form the reduced-dimensionality state representation F3. In another embodiment, the readout function may include a max-pool readout function. The state representation F3 may be processed using a log-probability function LP to form logits F4 that may be passed to an output layer or head H defining an action space of the control policy.

As shown, the output layer or head H may include predicted outputs defining all switchable states of all the actuators. In the shown example, the control action for the capacitor is represented by two head outputs $A_{Cap}$, for ON and OFF status. The control action for the voltage regulator is represented by a number of head outputs $A_{Reg}$ which is equal to the number of tapping numbers of the voltage regulator. In the shown example, a continuous battery is considered, for which the control action may be represented by a single head output $A_{Bat}$, indicating a probability distribution parameterized by a set of parameters which may be learnable (e.g., mean and standard deviation of a Gaussian distribution). For a discrete battery, the number of head outputs $A_{Bat}$ may equal the number of discharge power states of the battery.

An actor-critic algorithm may additionally include a value network, which may comprise the same initial layers as the shown policy network (including the GNN) but a different output layer or head for predicting a value of a control action predicted by the policy network. The algorithm, when executed, may update both the policy network and the value network by determining a loss associated with an output of the value network based on a determination of a reward resulting from the control action output by the policy network.

In the embodiments described above, the graph representation of the power distribution system follows the topology of the physical power distribution system where the edges represent physical connections (e.g., lines, transformers, etc.) between the nodes. This representation, while useful as described above, may limit the information propagation between nodes when using a limited number of layers in the GNN. For example, in this case, changing the features of one node may have a larger effect on nodes that are directly connected to it as compared to nodes that are far away. However, from the power systems perspective, not all the actuators may necessarily behave in the same way.

Certain actuators, such as voltage regulators, may have a global effect, while other actuators, such as batteries and capacitors may have a more local effect. This finding may be confirmed by conducting a sensitivity analysis on the power distribution system by running a random control policy for a single episode using only one active actuator (while disabling the other actuators) and observing the co-variance of the voltage between the actuator node (i.e, node associated with the actuator) and the voltage of all other nodes. Based on the measured covariances, it may be determined that a voltage regulator clearly has a global effect on every node, even though not all the nodes may be directly connected to the voltage regulator node. In contrast, capacitors and batteries may have a more local effect.

Using a GNN based on the original topology (i.e., based on physical connections) may provide a very good representation for a capacitor and a battery because they may only have impact on neighboring nodes (typically within 2-3 hops) to which they are connected. This may not be the case with a voltage regulator where the graph connectivity cannot fully describe what the actuator effect is.

The disclosed methodology may be further improved bearing this observation mind. In the following description, two approaches have been proposed.

According to a first approach, the graph representation may be augmented to take into account the global effect of certain actuators such as voltage regulators. Referring to the example shown in FIG. 1, to properly represent the existence of a node with global effects, such as the voltage regulator-node N2R, the graph representation of the power distribution may be augmented as illustrated in FIG. 5. The graph augmentation may be implemented in the following way: Given the original graph topology based on the physical system (e.g., see FIG. 1), the graph representation may be traversed from the root (i.e., source bus N1) to the leaves to record the downstream nodes of every voltage regulator encountered during the traversal. In the example of FIG. 1, there is only one voltage regulator node N2R. The graph representation may then be augmented by adding an edge between the identified voltage regulator node(s) and all its downstream nodes. This is illustrated in FIG. 5, where the dashed lines originating from the voltage regulator node N2R represent virtual connections with all of the downstream nodes. The virtual connections may effectively mimic the global effects of the voltage regulator node by allowing information to propagate in the GNN layers even if a child node is not directly connected to the voltage regulator node.

A second approach may involve modifying the readout function of the control policy. Referring to FIG. 4, in the example embodiments described above, a mean-pool (or max-pool) readout function was employed to average the nodal embeddings of all the nodes from the final GNN layer in the policy/value networks to form logits that were passed to the output (dense) layer defining the action space. According to the second approach, a local readout function is proposed for processing the nodal embeddings in the final GNN layer. In this case, instead of averaging the embeddings of all nodes, only the embeddings of the actuator nodes may be taken and stacked together to form the reduced-dimensionality state representation F3, from which the logits F4 to the output layer H may be determined. This architecture may thus correspond to control actions computed based on the nodal embeddings of the capacitor, voltage regulator, and battery nodes only.

Figure 6:
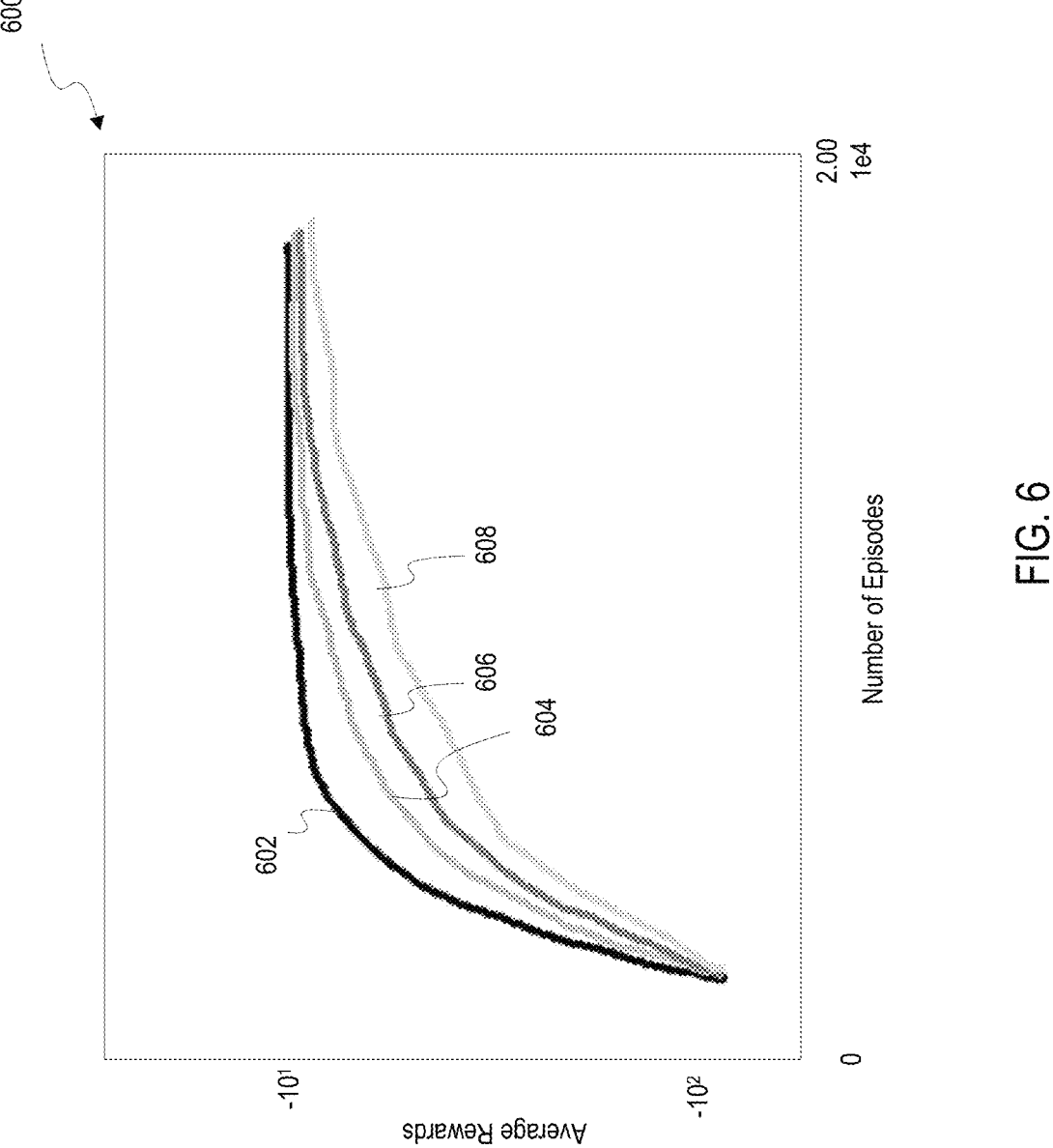
FIG. 6 illustrates a visualization of the effects of adding graph augmentation and/or localized readout function based only on nodes with controllable grid assets.

FIG. 6 illustrates a visualization 600 of exploring the above-described approaches of graph augmentation and using a local readout function. The visualization 600 shows a plot of average rewards versus number of episodes. Here, the plot 602 pertains to an augmented-graph PPO with local readout function; the plot 604 pertains to a graph PPO with local readout function; the plot 606 pertains to an augmented-graph PPO with a mean-pool readout function; and the plot 608 pertains to a graph PPO with a mean-pool readout function. In summary, it can be seen that the choice of readout functions can significantly affect the performance of the control policy, and graph augmentation can have added benefits when paired with the local readout function.

Figure 7:
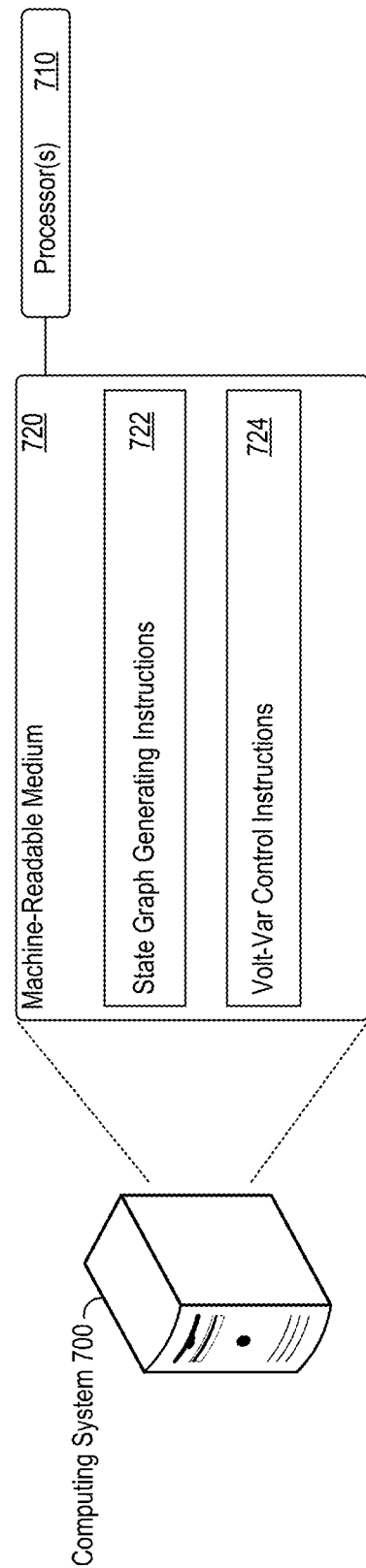
FIG. 7 illustrates a computing system that can support volt-car control of a power distribution system according to disclosed embodiments.

FIG. 7 shows an example of a computing system 700 that can support volt-var control of a power distribution system according to disclosed embodiments. The computing system 700 may, for example, form part of a grid control system. The computing system 700 includes at least one processor 710, which may take the form of a single or multiple processors. The processor(s) 710 may include a central processing unit (CPU), a graphics processing unit (GPU), a neural processing unit (NPU), a microprocessor, or any hardware device suitable for executing instructions stored on a memory comprising a machine-readable medium. The computing system 700 further includes a machine-readable medium 720. The machine-readable medium 720 may take the form of any non-transitory electronic, magnetic, optical, or other physical storage device that stores executable instructions, such as state graph generating instructions 722 and volt-var control instructions 724, as shown in FIG. 7. As such, the machine-readable medium 720 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 700 may execute instructions stored on the machine-readable medium 720 through the processor(s) 710. Executing the instructions (e.g., the state graph generating instructions 722 and the volt-var control instructions 724) may cause the computing system 700 to perform any of the technical features described herein, including according to any of the features of the state graph generator 204 and the volt-var controller 216 described above.

The systems, methods, devices, and logic described above, including the state graph generator 204 and the volt-var controller 216, may be implemented in many different ways in many different combinations of hardware, logic, circuitry, and executable instructions stored on a machine-readable medium. For example, these engines may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the state graph generator 204 and the volt-var controller 216. Computer readable program instructions described herein can be downloaded to respective computing/processing devices from a computer readable storage medium or to an external computer or external storage device via a network, for example, the Internet, a local area network, a wide area network and/or a wireless network.

The processing capability of the systems, devices, and engines described herein, including the state graph generator 204 and the volt-var controller 216 may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

Although this disclosure has been described with reference to particular embodiments, it is to be understood that the embodiments and variations shown and described herein are for illustration purposes only. Modifications to the current design may be implemented by those skilled in the art, without departing from the scope of the patent claims.

What is claimed is:

1. A method for controlling a power distribution system comprising a number of nodes and controllable grid assets associated with at least some of the nodes, the method comprising:
    acquiring observations via measurement signals associated with respective nodes, generating a graph representation of a system state of the power distribution system based on the observations and topological information of the power distribution system, wherein the topological information is used to determine edges defining connections between nodes and the observations are used to determine nodal features of respective nodes, the nodal features indicative of a measured electrical quantity and a status of controllable grid assets associated with the respective node, and
    processing the graph representation of the system state using a control policy trained by reinforcement learning to output a control action for effecting a change of status of one or more of the controllable grid assets, to regulate voltage and reactive power flow in the power distribution system based on a volt-var optimization objective,
    wherein the control policy comprises a graph neural network for generating nodal embeddings of respective nodes based on the observations and the topological information using a mechanism of message-passing between neighboring nodes, wherein the output control action is predicted based on the nodal embeddings.

2. The method according to claim 1, wherein the volt-var optimization objective is defined by a combination of costs including voltage violation at nodes, power losses and control error pertaining to frequency of change of status of the controllable grid assets.

3. The method according to claim 1, wherein the reinforcement learning comprises, over a number of episodes of trial, optimizing trainable parameters of the control policy to maximize a cumulative reward resulting from a sequence of control actions for each episode, based on a reward function defined by the volt-var optimization objective.

4. The method according to claim 3, wherein the sequence of control actions is generated based on respective graph representations of simulated system states of the power distribution system using observations from a simulation environment to determine respective nodal features and the topological information to determine edges defining connection between nodes.

5. The method according to claim 1, wherein the output control action is predicted from an action space defined by switchable states of the controllable grid assets.

6. The method according to claim 5, wherein the controllable grid assets have discrete switchable states or a combination of discrete and continuous switchable states.

7. The method according to claim 1, wherein the controllable grid assets comprise one or more voltage regulators, one or more capacitors, and one or more batteries.

8. The method according to claim 1, wherein the measured electrical quantity comprises a nodal voltage and/or power.

9. The method according to claim 1, wherein the power distribution system comprises one or more unmeasured nodes from which measurement signals are missing, wherein the nodal embeddings of the one or more unmeasured nodes are generated based on observations from neighboring measured nodes using the message passing mechanism.

10. The method according to claim 1, wherein the nodal embeddings are processed via a readout function to form logits for an output layer defining an action space, wherein the readout function includes a stacking of nodal embeddings of nodes associated with controllable grid assets.

11. The method according to claim 1, comprising augmenting the graph representation of the system by:

identifying one or more nodes associated with controllable grid assets having a global effect on the power distribution system, and for each identified node, adding an edge between the identified node and all downstream nodes.

12. A non-transitory computer-readable storage medium including instructions that, when processed by a computing system, configure the computing system to perform the method according to claim 11.

13. A system for controlling a power distribution system comprising a number of nodes and controllable grid assets associated with at least some of the nodes, the system comprising:

measurement devices for communicating measurement signals associated with respective nodes, and a computing system, comprising:

one or more processors, and a memory storing algorithmic modules executable by the one or more processors, the algorithmic modules comprising:

a state graph generator configured to generate a graph representation of a system state of the power distribution system based on observations acquired via the measurement signals and topological information of the power distribution system, wherein the topological information is used to determine edges defining connections between nodes and the observations are used to determine nodal features of respective nodes, the nodal features indicative of a measured electrical quantity and a status of controllable grid assets associated with the respective node, and a volt-var controller configured to process the graph representation of the system state using a control policy trained by reinforcement learning to output a control action for effecting a change of status of one or more of the controllable grid assets, to regulate voltage and reactive power flow in the power distribution system based on a volt-var optimization objective, wherein the control policy comprises a graph neural network for generating nodal embeddings of respective nodes based on the observations and the topological information using a mechanism of message-passing between neighboring nodes, wherein the output control action is predicted based on the nodal embeddings.

* * * * *